United States Patent
Kawarada et al.

(10) Patent No.: US 8,808,812 B2
(45) Date of Patent: Aug. 19, 2014

(54) ORIENTED CARBON NANOTUBE MANUFACTURING METHOD

(75) Inventors: Hiroshi Kawarada, Tokyo (JP); Ryogo Kato, Tokyo (JP); Toshiyuki Ohashi, Saitama (JP); Toshio Tokune, Saitama (JP); Hidefumi Nikawa, Saitama (JP)

(73) Assignees: Honda Motor Co., Ltd., Tokyo (JP); Waseda University, Tokyo (JP)

( * ) Notice: Subject to any disclaimer, the term of this patent is extended or adjusted under 35 U.S.C. 154(b) by 90 days.

(21) Appl. No.: 13/391,918

(22) PCT Filed: Aug. 30, 2010

(86) PCT No.: PCT/JP2010/064719
§ 371 (c)(1),
(2), (4) Date: Feb. 23, 2012

(87) PCT Pub. No.: WO2011/025000
PCT Pub. Date: Mar. 3, 2011

(65) Prior Publication Data
US 2012/0156392 A1  Jun. 21, 2012

(30) Foreign Application Priority Data
Aug. 31, 2009 (JP) ................. 2009-200586

(51) Int. Cl.
*H05H 1/30* (2006.01)
*C01B 31/02* (2006.01)
*B82Y 30/00* (2011.01)
*B82Y 40/00* (2011.01)
*H01J 37/32* (2006.01)

(52) U.S. Cl.
CPC ............ *B82Y 30/00* (2013.01); *C01B 31/0233* (2013.01); *C01B 2202/08* (2013.01); *B82Y 40/00* (2013.01); *H01J 37/32192* (2013.01); *H01J 37/3222* (2013.01)

USPC ........ 427/575; 427/249.1; 427/573; 427/577; 118/723 MW; 118/723 AN

(58) Field of Classification Search
USPC ..................... 427/249.1, 569, 575, 573, 577; 118/723 MW, 723 AN
See application file for complete search history.

(56) References Cited

U.S. PATENT DOCUMENTS

2010/0034984 A1*  2/2010  Asmussen et al. ............ 427/575

FOREIGN PATENT DOCUMENTS

JP    2002-190475 A    7/2002
JP    2004-161539 A    6/2004
(Continued)

OTHER PUBLICATIONS

Zhong et al; Low temperature synthesis of extremely dense and vertically aligned single-walled carbon nanotubes; Japanese journal of applied physics; vol. 44, No. 4A, 2005, pp. 1558-1561.*
Zhong, G., Iwasaki, T., Honda, K., Furukawa, Y., Ohdomari, I., and Kawarada, H., "Low Temperature Synthesis of Extremely Dense and Vertically Aligned Single-Walled Carbon Nanotubes," Japanese Journal of Applied Physics, 2005, vol. 44, No. 4A, pp. 1558-1561.
(Continued)

*Primary Examiner* — Elizabeth Burkhart
(74) *Attorney, Agent, or Firm* — Capitol City TechLaw, PLLC

(57) ABSTRACT

Disclosed is a method capable of accelerating the growth of oriented carbon nanotubes when manufacturing the oriented carbon nanotubes by a plasma CVD. Under the circulation of a gas which is the raw material of the carbon nanotubes, plasma is generated by an antenna (6) provided in a depressurized treatment chamber (2), and substrates (9, 15) provided with a reaction prevention layer and a catalyst material layer which are formed on a base material are held at a distance, to which a radical can reach and an attack of an ion generated as a by-product of the radical can be avoided, from a plasma generation area (7). The tip (6a) of the antenna (6) can be controlled so as to match with the position of the anti-node of a stationary wave (27) of microwaves.

16 Claims, 7 Drawing Sheets

(56) References Cited

FOREIGN PATENT DOCUMENTS

| | | | |
|---|---|---|---|
| JP | 2005-187309 A | | 7/2005 |
| JP | 2005-350342 A | | 12/2005 |
| JP | 2006-036593 | * | 2/2006 |
| JP | 2006-036593 A | | 2/2006 |
| JP | 2007-314391 A | | 12/2007 |
| JP | 2008-038164 A | | 2/2008 |
| JP | 2008-303114 A | | 12/2008 |

OTHER PUBLICATIONS

Ren, Z.F., Huang, Z.P., Xu, J.W., Wang, J.H., Bush, P., Siegal, M.P., and Provencio, P.N., "Synthesis of Large Arrays of Well-Aligned Carbon Nanotubes on Glass," Science, Nov. 6, 1998, vol. 282, pp. 1105-1107, American Association for the Advancement of Science, Washington, DC.

* cited by examiner

US 8,808,812 B2

ORIENTED CARBON NANOTUBE MANUFACTURING METHOD

TECHNICAL FIELD

The present invention relates to a manufacturing method of oriented carbon nanotubes oriented in a cross direction, for example perpendicular direction to a substrate grown with a plurality of carbon nanotubes lined up in a longitudinal direction.

BACKGROUND ART

Hitherto, there has been known an oriented carbon nanotube manufacturing method by the usage of a plasma CVD for manufacturing oriented carbon nanotubes oriented in a perpendicular direction to a substrate in the synthesis of multi-walled carbon nanotubes for an electric field emitter (for example, refer to non-patent document 1).

According to the method by the usage of plasma CVD, the improved field effect by a sheath formed by the plasma has been considered to contribute to the orientation of carbon nanotubes. However, there is such a problem in the method by the usage of plasma CVD that while carbon radicals are being generated in a plasma generation area, the substrate is attacked by ions generated as a by-product of the carbon radicals, which caused the growing carbon tubes to be etched. Thereby, the method by the usage of plasma CVD is disadvantageous in growing long carbon nanotubes, and it is more disadvantageous in growing single-walled carbon nanotubes since the single-walled carbon nanotubes are subjected to etching easier than the multi-walled nanotubes.

In order to solve the mentioned problem, the inventors disclosed an art (for example, refer to patent document 1) where the substrate is held at a distance to the plasma generation area which is capable of preventing the substrate from being attacked by the ions generated as a by-product of the radicals generated at the plasma generation area and is reachable by the radicals at a radical state in an antenna-type plasma CVD. In the mentioned art, the substrate is provided with a reaction prevention layer which is formed on a base material and a catalyst material layer which is formed on the reaction prevention layer, and the catalyst material layer is further formed with a dispersion layer.

According to the mentioned configuration, it is possible to prevent the substrate from being attacked by the ions originated from the plasma; since the substrate is unnecessary to be exposed to a high temperature, it is also possible to inhibit thermal aggregation of catalyst. Consequently, it is possible to manufacture oriented carbon nanotubes formed from long single-walled carbon nanotubes.

PRIOR ART REFERENCES

Patent Documents

Patent document 1: Japanese Patent Laid-open No. 2006-36593

Non-Patent Documents

Non-Patent Document 1: Science, 282, 1105 (1998)

SUMMARY OF THE INVENTION

Problems to be Solved by the Invention

However, due to the mechanical limitations of applying an electrical power for generating plasma, a gas pressure and a temperature, the growth of oriented carbon nanotubes formed from long single-walled carbon nanotubes has a limit of 270 µm/hr.

The present invention has been accomplished in view of the aforementioned problems, and it is therefore an object of the present invention to provide a method capable of accelerating the growth of oriented carbon nanotubes formed from long single-walled nanotubes when manufacturing the oriented carbon nanotubes by a plasma CVD.

Means for Solving the Problems

To attain an object described above, the present invention provides a manufacturing method of oriented carbon nanotubes by the usage of an antenna typed plasma CVD, wherein a plasma is generated by an antenna provided in a depressurized treatment chamber under the circulation of a gas which is the raw material of the carbon nanotube, and a substrate provided with a reaction prevention layer and a catalyst material layer which are formed on a base material is held at a distance to a plasma generation area which is capable of preventing the substrate from being attacked by an ion generated as a by-product of a radical generated at the plasma generation area and is reachable by the radical at a radical state, and a tip of the antenna is controlled to match with the position of the anti-node of a stationary wave of microwaves.

In the manufacturing method of the present invention, the antenna typed plasma CVD is controlled so that the tip of the antenna matches with the position of an anti-node (¼ of a wavelength) of a stationary wave of microwaves having a predefined wavelength (for example, 2.45 GHz). According thereto, it is possible to concentrate the plasma accurately on the tip of the antenna only, which makes it possible to accelerate the growth of carbon nanotubes formed on the substrate.

In the manufacturing method of the present invention, it is preferable that a microwave applying member is disposed at the outside of the treatment chamber, the treatment chamber is hermetically connected to the microwave applying member via a quartz window, and the antenna is disposed in the quartz window. According thereto, it is possible to introduce the microwaves applied by the microwave applying member from the atmosphere into the depressurized treatment chamber via the quartz window at low loss, which makes it possible to inhibit the temperatures at the quartz window and the antenna from rising. Consequently, the tip of the antenna can be maintained at the highest temperature, and it is possible to generate plasma accurately only at the tip of the antenna.

In the manufacturing method of the present invention, in order to further inhibit the temperature rising at the quartz window and the antenna, it is preferable that the microwave applying member is provided with a cooling member. The cooling member may be a first water cooling pipe disposed inside the microwave applying member or a second water cooling pipe disposed around the periphery of the microwave applying member. It is acceptable to dispose only the first or the second water cooling pipe; however, in order to inhibit efficiently the temperature at the quartz window from rising, it is preferable to dispose both.

By disposing the cooling member, it is possible to alleviate the limitations on the temperature of the substrate, the pressure in the treatment chamber and the electrical power applied to generate plasma, which makes it possible to further accelerate the growth of carbon nanotubes formed on the substrate.

Therefore, in the manufacturing method of the present invention, it is preferable that the substrate is maintained at a temperature from 650° C. to 800° C. If the temperature of the substrate is less than 650° C., it may be impossible to accelerate efficiently the growth of the carbon nanotubes. On the other hand, if the temperature of the substrate is greater than 800° C., the thermal aggregation of catalyst tends to be prominent, leading to the gigantism of fine catalyst particles; thereby, there may be cases where the carbon nanotubes of a thin diameter are not obtained.

In the manufacturing method of the present invention, it is preferable that the pressure in the treatment chamber is maintained in a range of 2.66 to 13.33 kPa and the electrical power applied for generating the plasma is maintained in a range of 60 to 180 W.

If the pressure in the treatment chamber is less than 2.66 kPa or if the electrical power applied for generating the plasma is less than 60 W, there may be cases where the carbon nanotubes will not grow or the growth thereof will be remarkably small. On the other hand, if the pressure in the treatment chamber is greater than 13.33 kPa or if the electrical power applied for generating the plasma is greater than 180 W, there may be cases where the density of generated radicals will be too large. Thereby, amorphous carbons or the other type of carbons will adhere to the surroundings of the carbon nanotubes, deteriorating the quality of the obtained carbon nanotubes.

In the manufacturing method of the present invention, it is preferable that the catalyst material layer has a thickness less than 2 nm. If the catalyst material layer formed on the substrate is greater than 2 nm, the multi-walled carbon nanotubes grow selectively; thereby, it may not be possible to obtain the long carbon nanotubes of a thin diameter.

MODE FOR CARRYING OUT THE INVENTION

Hereinafter, an embodiment of the present invention will be described in detail with reference to the drawings.

Figure 1:
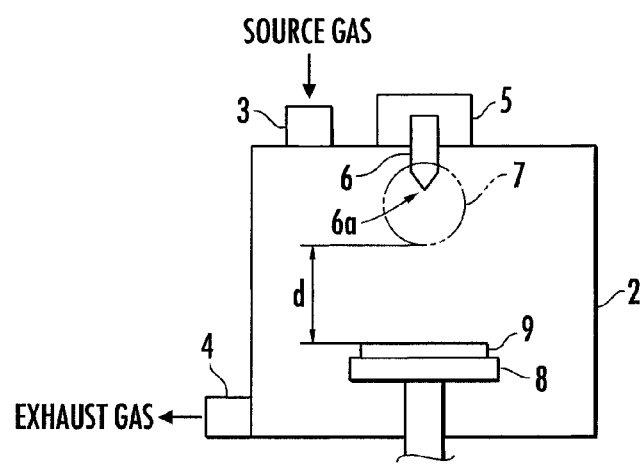
FIG. 1 is a sectional view illustrating a structural example of a device used in a manufacturing method of the present invention.
Figure 2:
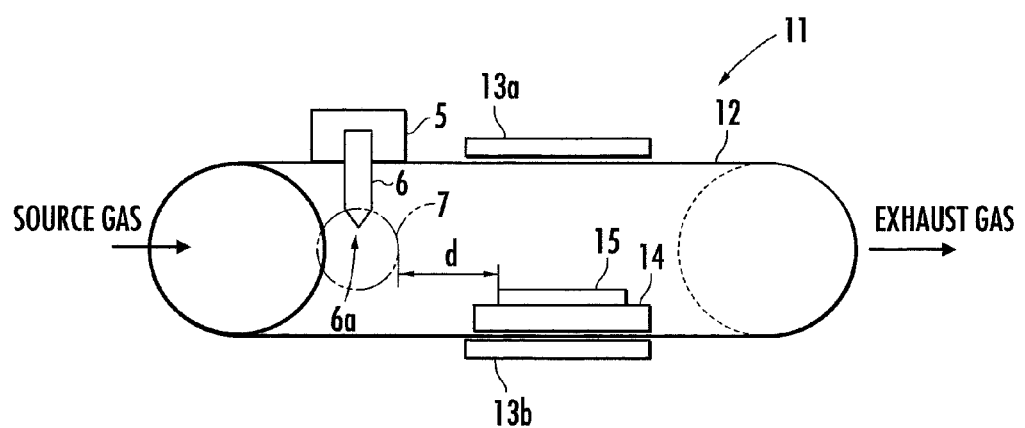
FIG. 2 is a sectional view illustrating another structural example of the device used in the manufacturing method of the present invention.

A manufacturing method of oriented carbon nanotubes of the present embodiment can be implemented by a device illustrated in FIG. 1 or FIG. 2.

FIG. 1 illustrates an example of a CVD device 1 provided with a box-shaped chamber (treatment chamber) 2. A top surface of the chamber 2 is disposed with a source gas introducing member 3 configured to introduce a gas which is the raw material of the carbon nanotubes (hereinafter, abbreviated as source gas) and a bottom surface thereof is provided with a gas discharging member 4 configured to discharge gas in the chamber 2 to the outside. The gas discharge member 4 is connected with, for example, a vacuum pump (not shown). The top surface of the chamber 2 is further disposed with a microwave introducing pipe 5 and an antenna 6. Microwaves of a predefined wavelength (for example 2.45 GHz) are applied to a tip 6a of the antenna 6 to generate plasmas concentrated on the tip 6a. As a result thereof, a plasma generation area 7 is formed around the tip 6a.

A substrate heating member 8 is disposed inside the chamber 2 at a position facing to the microwave introducing pipe 5 and is configured to be freely movable along the vertical direction. A substrate 9 is supported on the substrate heating member 8. In the CVD device 1, a distance d between the plasma generation area 7 underneath the microwave introducing pipe 5 and the substrate 9 is adjusted by moving vertically the substrate heating member 8. As a result thereof, the distance d can be adjusted to such a distance that it is capable of preventing the substrate 9 from being attacked by ions generated as a by-product of radicals generated at the plasma generation area 7 and is reachable by the radicals at a radical state.

FIG. 2 illustrates an example of a CVD device 11 provided with a tubular chamber (treatment chamber) 12. The source gas is introduced from one end of the chamber 12 and the gas in the chamber 12 is discharged from the other end thereof to the outside. The gas discharging end of the chamber 12 is connected with, for example, a vacuum pump (not shown). A position nearby the source gas introducing end of the chamber 12 is disposed with microwave introducing pipe 5 and the antenna 6 similar to the CVD device 1. Microwaves of a predefined wavelength (for example 2.45 GHz) are applied to the tip 6a of the antenna 6 to generate plasmas concentrated on the tip 6a. As a result thereof, a plasma generation area 7 is formed around the tip 6a.

A pair of substrate heating members 13a and 13b sandwiching the chamber 12 are disposed at the downstream of the plasma generation area 7 with respect to the introduced source gas and are configured to move back and forth freely in the longitudinal direction of the chamber 12 with respect to the plasma generation area 7. A substrate supporting member 14 is disposed inside the chamber 12, facing to the substrate heating member 13b. A substrate 15 is supported on the substrate supporting member 14. In the CVD device 11, the distance d between the plasma generation area 7 and the substrate 15 is adjusted by moving the substrate heating members 13a and 13b. As a result thereof, the distance d can be adjusted to such a distance that it is capable of preventing the substrate 15 from being attacked by ions generated as a by-product of radicals generated at the plasma generation area 7 and is reachable by the radicals at a radical state.

Figure 3:
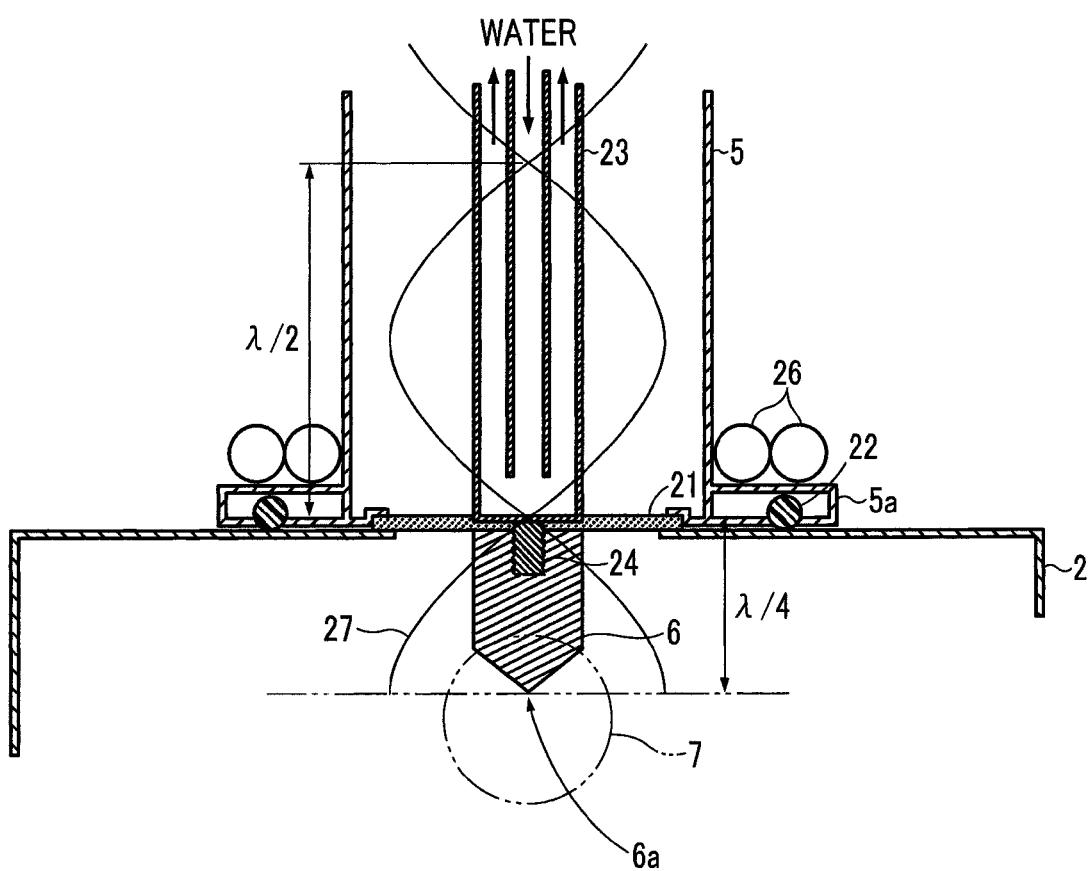
FIG. 3 is a sectional view illustrating a structural example of an antenna structure used in the manufacturing method of the present invention.

Hereinafter, an enlarged view of a portion around the antenna 6 in the CVD device 1 is illustrated in FIG. 3 as an example for describing the CVD device 1 and the CVD device 11.

The microwave introducing pipe 5 is disposed outside the chamber 2, and the chamber 2 is connected to the microwave introducing pipe 5 via a quartz window 21 disposed on the top surface. The microwave introducing pipe 5 is provided with a flange member 5a surrounding the quartz window 21. The chamber 2 is hermetically connected to the microwave introducing pipe 5 via an O-ring 22 disposed in the flange member 5a.

A water cooling pipe 23 is disposed inside the microwave introducing pipe 5 along the axis thereof. The tip end of the water cooling pipe 23 is disposed with a male screw member 24 penetrating through the quartz window 21, and the antenna 6 is screwed on the male screw member 24. The water cooling pipe 23 and the quartz window 21 are hermetically connected together via vacuum sealing.

Further, a water cooling pipe 26 is disposed on the flange member 5a surrounding the top end portion of the microwave introducing pipe 5.

In the CVD device 1, when a microwave having a wavelength of 2.45 GHz, for example, is radiated by a microwave generating device (not shown) disposed outside the microwave introducing pipe 5 into the microwave introducing pipe 5, the reflection of the microwave at open end of the tip 6a of the antenna 6 interferes with a progressive wave to form a stationary wave 27. The stationary wave 27 is accurately controlled in such a way that the position of the quartz 21 matches with a wave node thereof and the position of the tip 6a of the antenna 6 matches with an anti-node thereof (¼ wavelength, which is about 3 cm in length).

According to the CVD device 1 having the above configuration, the rising of temperature at the quartz window 21 is inhibited and the tip 6a of the antenna 6 has the highest temperature, it is possible for the plasma to be accurately concentrated only on the tip 6a of the antenna 6. As a result thereof, a plasma sphere (plasma generation area) 7 is formed around the tip 6a of the antenna 6.

Moreover, since the CVD device 1 is further provided with the water cooling pipe 26 surrounding the top end portion of the microwave introducing pipe 5 in addition to the water cooling pipe 23 inside the microwave introducing pipe 5, it is possible to further inhibit the temperature of the quartz window 21 from rising so as to make the temperature of the tip 6a of the antenna 6 relatively higher. It is desirable to perform an air cooling by a fan disposed outside the chamber 2 in addition to the cooling by the water cooling pipes 23 and 26 to further increase the cooling effect on the quartz window 21.

The base material for the substrate 9 or the substrate 15 may be given as silicon, glass, melted quartz, heat-resistant ceramics, heat-resistant steel plate or the like. The substrate 9 or the substrate 15 is provided with a reaction prevention layer formed on the base material and a catalyst material layer formed on the reaction prevention layer.

The reaction prevention layer prevents a reaction between the base material and the catalyst material layer. The reaction prevention layer is formed by evaporating aluminum, silicon, magnesium and oxides thereof, or a composite thereof on the base material to a thickness from 2 nm to 70 nm. The evaporation may be performed according to a sputtering method, a resistance heating method or an electron beam evaporation method. When aluminum is evaporated on the base material, aluminum is oxidized by oxygen remained in the chamber 2 or 12 in the film formation or oxidized due to air exposure after the film formation into aluminum oxide; thereby, it is preferable to form the reaction prevention layer from aluminum oxide.

The catalyst material layer is formed by evaporating iron, nickel, cobalt, palladium, platinum, yttrium, lanthanum, molybdenum, manganese, an alloy containing these elements, an oxide of these elements or the like on the reaction prevention layer to a thickness less than 2 nm, for example, from 0.025 to 1.5 nm. The evaporation may be performed according to a sputtering method, a resistance heating method or an electron beam evaporation method.

It is acceptable that the substrate 9 or the substrate 15 is disposed with a dispersion layer on the catalyst material layer. The dispersion layer can stabilize and disperse catalyst particles generated from the catalyst material layer, and can define the particle diameter to a desired size. The dispersion layer is formed by evaporating aluminum, silicon, magnesium and oxides thereof, a composite thereof or the like on the base material to a thickness of less than 6 nm without surpassing 3 times of the thickness of the catalyst material layer. The evaporation may be performed according to a sputtering method, a resistance heating method or an electron beam evaporation method.

In the present embodiment, the oriented carbon nanotube is manufactured by generating plasma in the chamber 2 or 12 with the substrate 9 in the CVD device 1 or the substrate 15 in the CVD device 11 maintained at a temperature from 650 to 800° C. The chamber 2 or 12 is depressurized and maintained at a pressure from 2.66 to 13.33 kPa by discharging the gas in the chamber 2 or 12 to the outside while the source gas is being supplied into the chamber 2 or 12. The electrical power applied for generating plasma is maintained at a range of 60 to 180 W, the long carbon nanotube of a thin diameter can be manufactured at a fast growth speed of 0.6 to 1.4 mm/hr.

Hereinafter, an example of the present invention and a contrast thereof will be described.

EXAMPLES

In the present example, the oriented carbon nanotube was manufactured by using the CVD device 1 illustrated in FIG. 1.

Silicon was used as the base material of the substrate 9, and the reaction prevention layer was formed from aluminum by evaporating aluminum according to the sputtering method or a combination of the resistance heating method and the electron beam evaporation method on the base material to a thickness of 5 to 70 nm. The catalyst layer was formed from ion by evaporating ion according to the sputtering method or a combination of the resistance heating method and the electron beam evaporation method on the reaction prevention layer to a thickness of 0.25 to 1.5 nm. In addition, in the case of forming the dispersion layer on the catalyst material layer, the dispersion layer was formed from aluminum by evaporating aluminum according to the sputtering method or a combination of the resistance heating method and the electron beam evaporation method on the reaction prevention layer to a thickness of 0.025 to 2 nm.

The substrate 9 was supported on the substrate heating member 8, and the chamber was depressurized by introducing the source gas by the source gas introducing member 3 and discharging the gas in the chamber 2 by the gas discharging member 4 to the outside. As the source gas, methane and hydrogen were circulated at 5 sccm and 45 sccm, respectively, to maintain the pressure in the chamber 2 at a range of 2.66 kPa to 10.6 kPa.

Thereafter, the substrate 9 was heated to a temperature ranged from 690° C. to 740° C. by the substrate heating member 8, a microwave having a wave length of 2.45 GHz was radiated by the microwave introducing pipe 5 into the chamber 2 to generate plasma at the tip 6a of the antenna 6. The output for the microwave (the electrical power applied for generating plasma) was set to range from 60 W to 180 W, and the distance d between the substrate 9 and the plasma generation area 7 was set to 50 mm. The microwave radiation was performed 5 minutes after the temperature of the substrate 9 reached to the mentioned temperature from room temperature.

The growth of carbon nanotubes under different manufacturing conditions were calculated according to the length of the carbon nanotube and the required manufacturing time obtained at the respective manufacturing condition. Different manufacturing conditions of the oriented carbon nanotube and the growth of the carbon nanotube under the respective manufacturing condition are illustrated in Table 1 and Table 2.

Table 1

TABLE 1

| sample | evaporation method | dispersion layer (nm) | catalyst material layer (nm) | reaction prevention layer (nm) | temperature (° C.) | pressure (kPa) | applied power (W) | length (mm) | manufacturing time (min) | growth (mm/hr) |
|---|---|---|---|---|---|---|---|---|---|---|
| 1 | A | 0.25 | 0.1 | 5 | 690 | 10.6 | 180 | 0.3 | 30 | 0.6 |
| 1.1 | A | 0.025 | 0.025 | 5 | 690 | 10.6 | 180 | 0.3 | 30 | 0.6 |
| 2 | A | 0.5 | 0.2 | 5 | 690 | 7.98 | 120 | 0.3 | 30 | 0.6 |
| 3 | A | 0 | 0.5 | 5 | 690 | 7.98 | 120 | 0.3 | 30 | 0.6 |
| 4 | A | 0.5 | 0.5 | 5 | 690 | 7.98 | 120 | 1.5 | 30 | 3 |
| 5 | A | 0.5 | 0.5 | 5 | 690 | 7.98 | 120 | 2.3 | 60 | 2.3 |
| 6 | A | 0.5 | 0.5 | 10 | 690 | 7.98 | 120 | 1.5 | 30 | 3 |
| 7 | A | 0.5 | 0.5 | 20 | 690 | 7.98 | 120 | 1.5 | 30 | 3 |
| 8 | A | 0.5 | 0.5 | 70 | 690 | 7.98 | 120 | 1.5 | 30 | 3 |
| 9 | A | 1 | 0.5 | 5 | 690 | 7.98 | 120 | 1.5 | 30 | 3 |
| 10 | A | 1 | 0.5 | 5 | 690 | 7.98 | 120 | 2.4 | 60 | 2.4 |
| 11 | A | 1 | 0.5 | 5 | 690 | 2.66 | 60 | 3 | 300 | 0.6 |
| 12 | A | 1.5 | 0.5 | 5 | 690 | 7.98 | 120 | 2 | 30 | 4 |
| 13 | A | 1 | 0.5 | 5 | 740 | 7.98 | 120 | 3 | 60 | 3 |
| 14 | A | 0 | 1 | 5 | 690 | 7.98 | 120 | 1 | 30 | 2 |
| 15 | A | 0.5 | 1 | 5 | 690 | 7.98 | 120 | 1 | 30 | 2 |
| 16 | A | 1 | 1 | 5 | 690 | 7.98 | 120 | 1 | 30 | 2 |
| 17 | A | 1 | 1 | 5 | 690 | 7.98 | 120 | 2.9 | 60 | 2.9 |
| 18 | A | 1 | 1 | 5 | 690 | 7.98 | 120 | 5 | 150 | 2 |
| 19 | A | 1 | 1 | 5 | 690 | 7.98 | 120 | 4 | 60 | 4 |
| 20 | A | 1 | 1 | 5 | 690 | 7.98 | 120 | 4.5 | 300 | 0.9 |

Evaporation method: A: Sputtering, B: heat-resistant, electron beam

Table 2

TABLE 2

| sample | evaporation method | dispersion layer (nm) | catalyst material layer (nm) | reaction prevention layer (nm) | temperature (° C.) | pressure (kPa) | applied power (W) | length (mm) | manufacturing time (min) | growth (mm/hr) |
|---|---|---|---|---|---|---|---|---|---|---|
| 21 | B | 1 | 1 | 5 | 690 | 7.98 | 120 | 0.5 | 30 | 1 |
| 22 | A | 1 | 1 | 5 | 740 | 7.98 | 120 | 8 | 300 | 1.6 |
| 23 | A | 1 | 1 | 5 | 740 | 10.6 | 180 | 4 | 60 | 4 |
| 24 | B | 0 | 1.5 | 5 | 690 | 7.98 | 120 | 1 | 30 | 2 |
| 25 | B | 1.5 | 1.5 | 5 | 690 | 7.98 | 120 | 1.2 | 30 | 2.4 |
| 26 | B | 2 | 1.5 | 5 | 690 | 7.98 | 120 | 1 | 30 | 2 |

Evaporation method: A: Sputtering, B: heat-resistant, electron beam

[Contrast]

In the present contrast, the oriented carbon nanotube was manufactured by using the CVD device 1 illustrated in FIG. 1.

Silicon was used as the base material of the substrate 9, and the reaction prevention layer was formed from aluminum by evaporating aluminum according to the sputtering method, the resistance heating method or the electron beam evaporation method on the base material to a thickness of 5 to 70 nm. The catalyst layer was formed from iron by evaporating ion according to the sputtering method, the resistance heating method or the electron beam evaporation method on the reaction prevention layer to a thickness of 0.1 to 2 nm. In addition, in the case of forming the dispersion layer on the catalyst material layer, the dispersion layer was formed from aluminum by evaporating aluminum according to the sputtering method, the resistance heating method or the electron beam evaporation method on the reaction prevention layer to a thickness of 0.25 to 2 nm.

The substrate 9 was supported on the substrate heating member 8, and the chamber was depressurized by introducing the source gas by the source gas introducing member 3 and discharging the gas in the chamber 2 by the gas discharging member 4 to the outside. As the source gas, methane and hydrogen were circulated at 5 sccm and 45 sccm, respectively, to maintain the pressure in the chamber 2 at 2.66 kPa.

Thereafter, the substrate 9 was heated to 600° C. by the substrate heating member 8, a microwave having a wave length of 2.45 GHz was radiated by the microwave introducing pipe 5 into the chamber 2 to generate plasma. The output for the microwave (the electrical power applied for generating plasma) was set to 60 W, and the distance d between the substrate 9 and the plasma generation area 7 was set to 50 mm. The microwave radiation was performed 5 minutes after the temperature of the substrate 9 reached to the mentioned temperature from room temperature.

The growth of a carbon nanotube under different manufacturing conditions was calculated according to the length of the carbon nanotubes and the required manufacturing time obtained at the respective manufacturing condition. Different manufacturing conditions of the oriented carbon nanotubes and the growth of the carbon nanotubes under the respective manufacturing condition are illustrated in Table 3.

TABLE 3

| sample | evaporation method | dispersion layer (nm) | catalyst material (nm) | reaction prevention layer (nm) | temperature (°C.) | pressure (kPa) | applied power (W) | length (mm) | manufacturing time (min) | growth (mm/hr) |
|---|---|---|---|---|---|---|---|---|---|---|
| 1 | A | 0.25 | 0.1 | 5 | 600 | 2.66 | 60 | 0.001 | 30 | 0.002 |
| 2 | A | 0.5 | 0.2 | 5 | 600 | 2.66 | 60 | 0.001 | 30 | 0.002 |
| 3 | A | 0.5 | 0.5 | 70 | 600 | 2.66 | 60 | 1.2 | 480 | 0.15 |
| 4 | A | 2 | 0.5 | 5 | 600 | 2.66 | 60 | 0.001 | 60 | 0.001 |
| 5 | A | 0 | 1 | 5 | 600 | 2.66 | 60 | 0.0715 | 60 | 0.0715 |
| 6 | A | 0.5 | 1 | 5 | 600 | 2.66 | 60 | 0.0438 | 60 | 0.0438 |
| 7 | A | 1 | 1 | 5 | 600 | 2.66 | 60 | 0.0812 | 60 | 0.0812 |
| 8 | B | 1.5 | 1.5 | 2 | 600 | 2.66 | 60 | 0.002 | 30 | 0.002 |
| 9 | B | 1 | 2 | 5 | 600 | 2.66 | 60 | 0.2 | 30 | 0.2 |
| 10 | B | 0 | 2 | 5 | 600 | 2.66 | 60 | 0.2 | 60 | 0.2 |

Evaporation method: A: Sputtering, B: heat-resistant, electron beam

It is obvious from Table 1 to Table 3 that the present invention has a remarkably effect that the growth is 0.6 to 4 mm/hr according to the manufacturing method of the present example compared to that the growth is no more than 0.2 mm/hr according to the present contrast.

Figure 4:
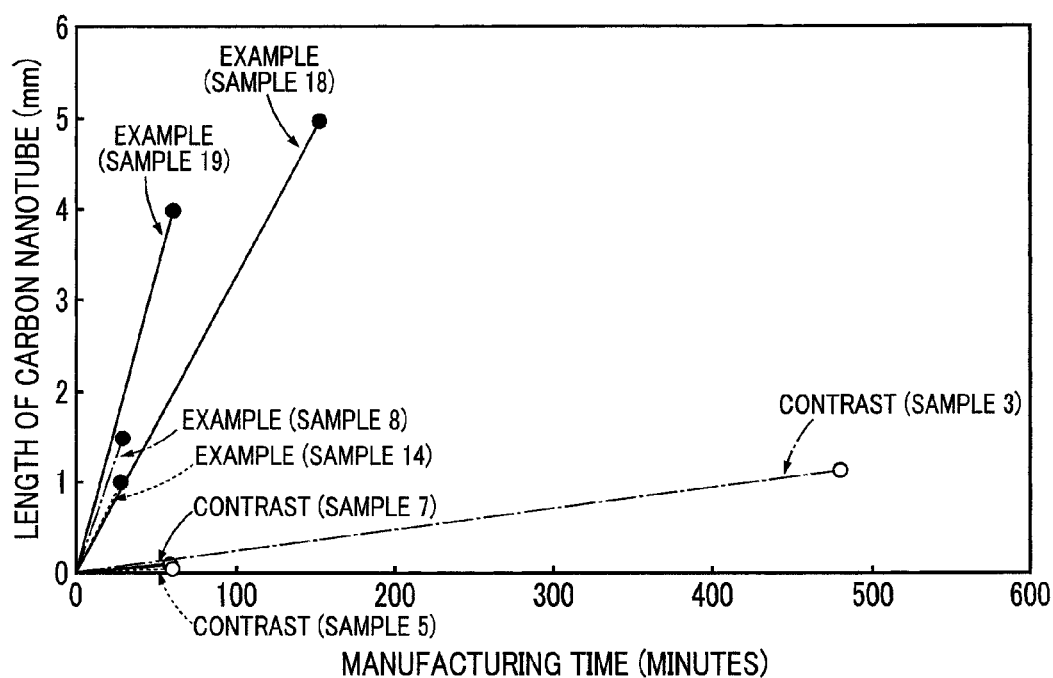
FIG. 4 is a graph illustrating a relationship between a length and a manufacturing time of carbon nanotubes.

Subsequently, (1) the relationship between the length and the manufacturing time of the carbon nanotubes manufactured from the sample 8 of the example and the sample 3 of the contrast, (2) the relationship between the length and the manufacturing time of the carbon nanotubes manufactured from the sample 14 of the example and the sample 5 of the contrast, and (3) the relationship between the length and the manufacturing time of the carbon nanotubes manufactured from the samples 18 and 19 of the example and the sample 7 of the contrast, the 3 relationship pairs are illustrated in FIG. 4. In each pair in the above 3 relationship pairs, the conditions of the substrate are identical for the sample of the example and the sample of the contrast.

In FIG. 4, the slope of each line illustrates the growth under each manufacturing condition. It is also obvious from FIG. 4 that the present invention has a remarkable effect on the growth of the carbon nanotubes according to the manufacturing method of the present example.

Figure 5A:
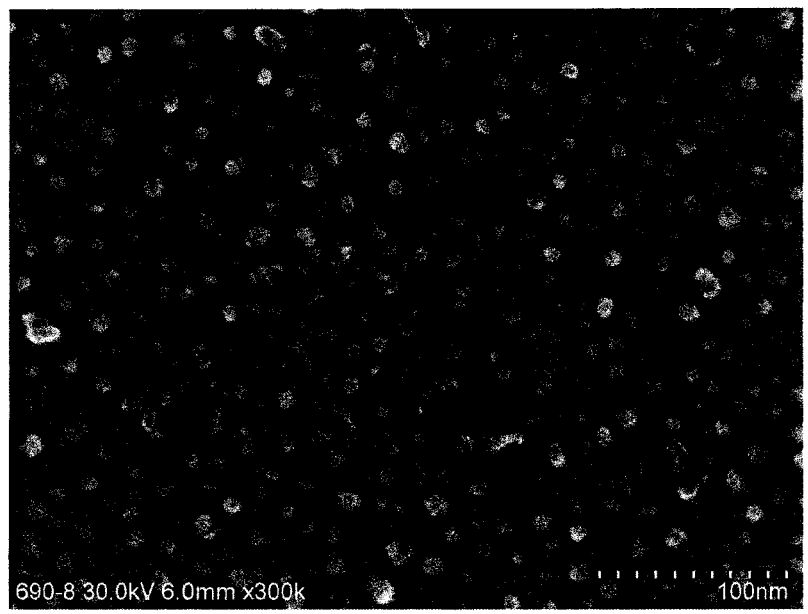
FIG. 5 is a scanning electron micrograph illustrating catalyst particles after a thermal treatment.

Hereinafter, the catalyst particles formed on the substrate used in the present example are compared with those formed on the substrate used in the present contrast. For the substrate used for the sample 24 of the present example, after the substrate was heated to the temperature (690° C.) listed in Table 1, it was cooled down to the room temperature and removed out without performing the manufacture of the carbon nanotubes. A scanning electron micrograph thereof is illustrated in FIG. 5(a). For the substrate used for the sample 10 of the present contrast, after the substrate was heated to the temperature (690° C.) listed in Table 2, it was cooled down to the room temperature and removed out without performing the manufacture of the carbon nanotubes. A scanning electron micrograph thereof is illustrated in FIG. 5(b).

Figure 5B:
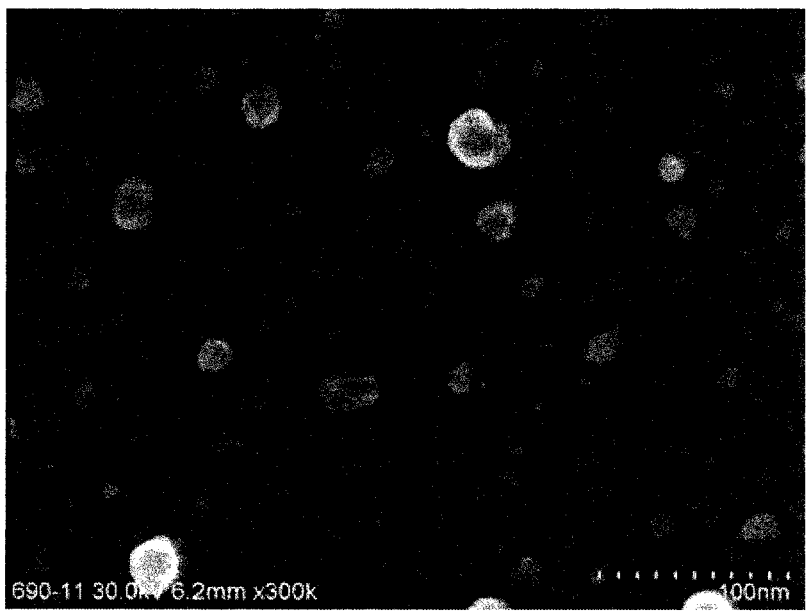

From FIG. 5(a) and FIG. 5(b), the catalyst particle density was $1.2 \times 10^{12}$ particles/cm² for the substrate used in the present example; in comparison, the catalyst particle density was $2 \times 10^{11}$ particles/cm² for the substrate used in the present contrast. It is obvious from the result that it is able to make smaller the catalyst particle diameter and maker greater the catalyst particle density which is directly related to the surface density of the manufactured carbon nanotubes by setting the thickness of the catalyst material layer less than 2 nm.

Figure 6:
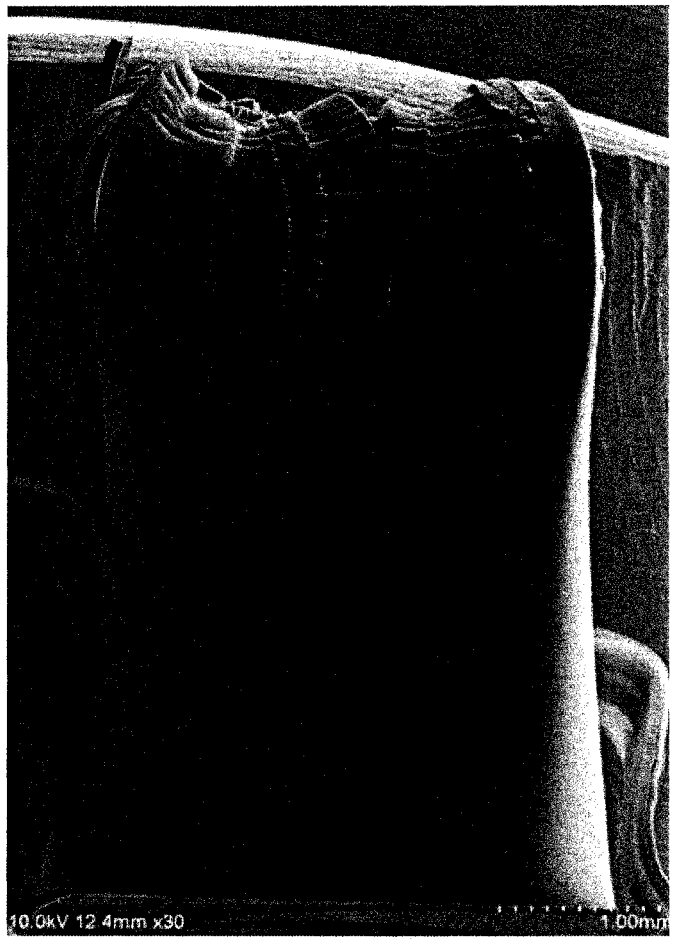
FIG. 6 is an example of a scanning electron micrograph of the carbon nanotubes manufactured according to the manufacturing method of the present invention.
Figure 7:
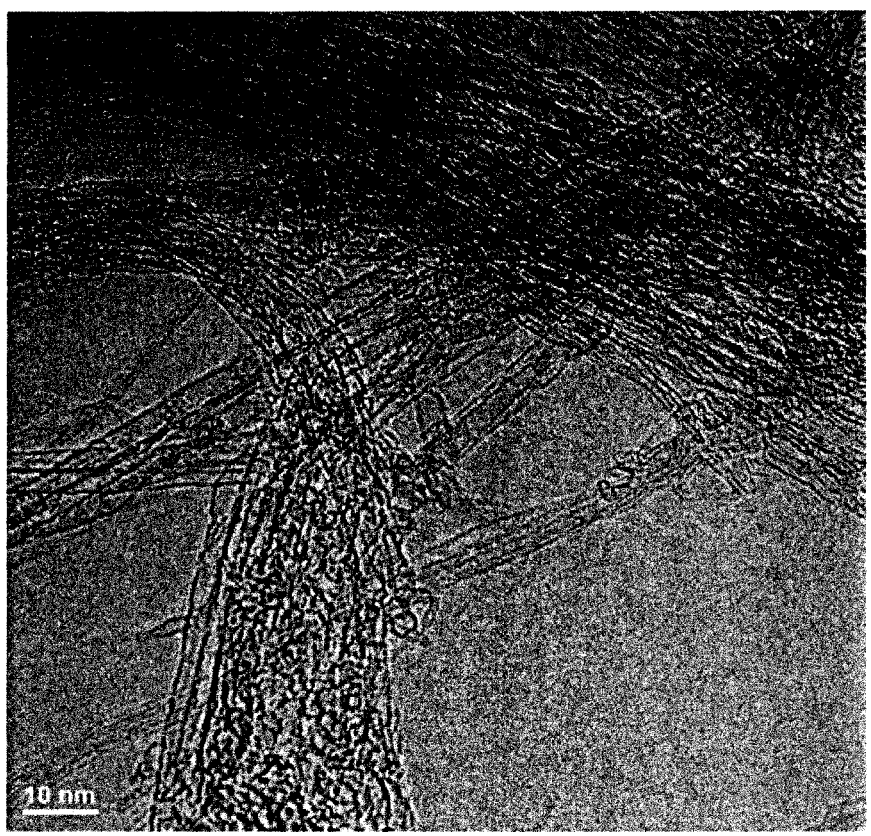
FIG. 7 is an example of a transmission electron micrograph of the carbon nanotubes manufactured according to the manufacturing method of the present invention.

A scanning electron micrograph of the carbon nanotubes manufactured under the manufacturing conditions for the sample 17 of the present example is illustrated in FIG. 6, and a transmission electron micrograph of the carbon nanotubes manufactured under the manufacturing conditions for the sample 10 of the present example is illustrated in FIG. 7. It is obvious from FIG. 6 that the carbon nanotubes have been made longer in the perpendicular direction with respect to the substrate. From FIG. 7, it is obvious that the carbon nanotubes manufactured according to the method of the present invention contain more single-walled carbon nanotubes of a thin diameter.

Figure 8:
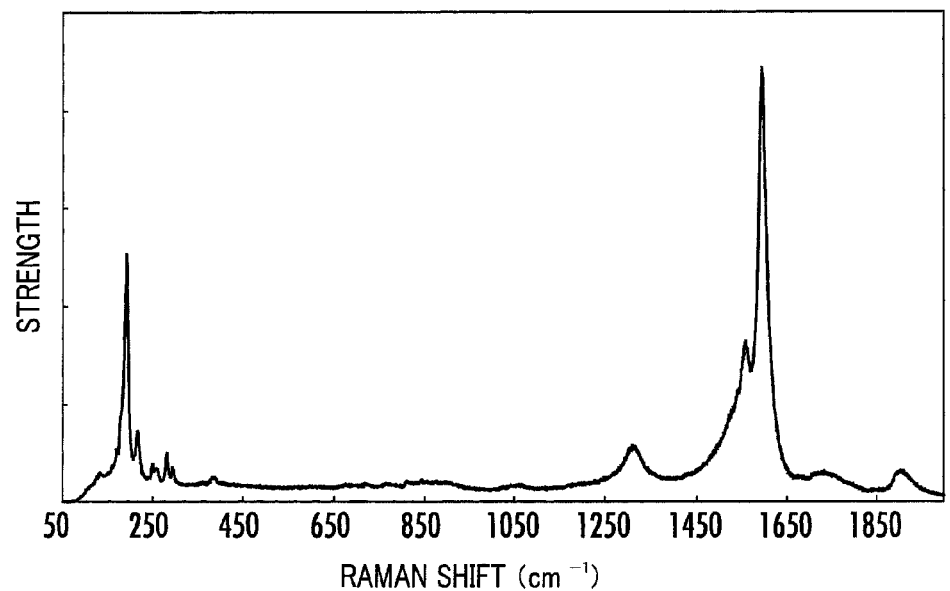
FIG. 8 is an example of a Raman spectrum of the carbon nanotubes manufactured according to the manufacturing method of the present invention.

The Raman spectrum (measured by He—Ne laser light having an excitation wavelength of 632.8 nm) of the carbon nanotubes manufactured according to the conditions of the sample 11 of the present example is illustrated in FIG. 8. From FIG. 8, a G-band originated from the graphite sheet is observed around 1600 cm$^{-1}$, a BWF peak originated from the thin metal tube is observed around 1550 cm$^{-1}$, and a D-band originated from defects is formed around 1300 cm$^{-1}$. In addition, a RBM peak originated from thin tubes such as single-walled carbon nanotubes is observed from 100 to 450 cm$^{-1}$. Therefore, it is obvious from FIG. 8 that the carbon nanotubes manufactured under the manufacturing conditions for the sample 11 of the present example contain more single-walled carbon nanotubes of a thin diameter.

Figure 9:
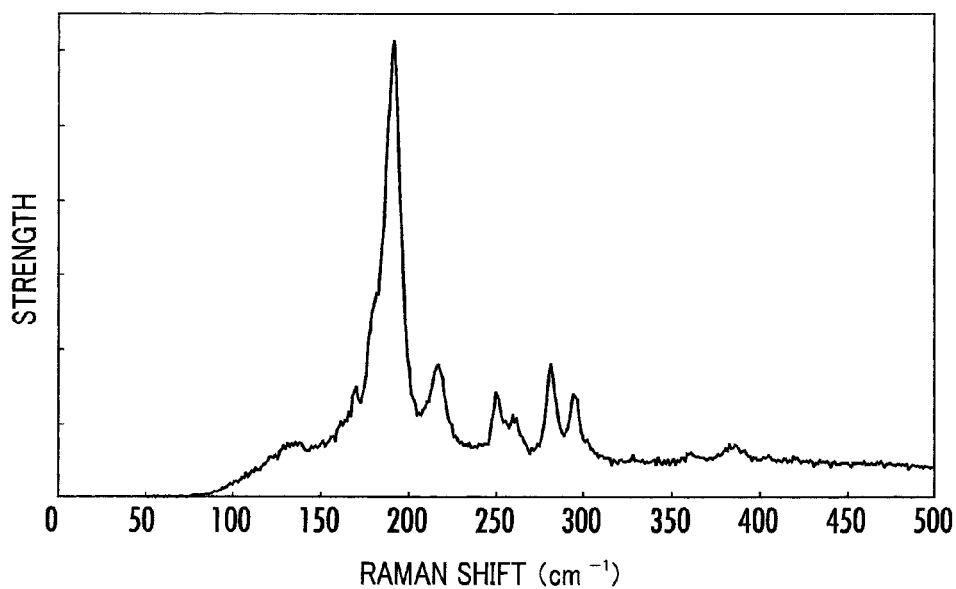
FIG. 9 is an example of a Raman RBM spectrum of the carbon nanotubes manufactured according to the manufacturing method of the present invention.

The Raman RBM spectrum of the carbon nanotubes manufactured according to the conditions of the sample 9 of the present example is illustrated in FIG. 9. From FIG. 9, clear peaks are observed from 100 to 450 cm$^{-1}$, denoting the presence of single-walled thin carbon nanotubes of an average diameter no greater than 2 nm.

DESCRIPTION OF REFERENCE NUMERALS 1, 11: CVD device; 2, 12: treatment chamber; 6: antenna; 6a: tip; 7: plasma generation area; 9, 15: substrate

What is claimed is:

1. A manufacturing method of oriented carbon nanotubes comprising
using an antenna typed plasma CVD device,
wherein
the CVD device is provided with a treatment chamber and a microwave applying member disposed outside the treatment chamber,
the treatment chamber is hermetically connected to the microwave applying member via a quartz window,
the microwave applying member is provided with a first water cooling pipe inside, the first water cooling pipe being hermetically connected to the quartz window, and
the quartz window is provided with an antenna having a tip protruding to an inside of the treatment chamber, under the circulation of a gas which is the raw material of the carbon nanotubes, microwaves applied by the microwave applying member are introduced into the treatment chamber depressurized to a predefined pressure via the quartz window to generate plasma at the antenna, a substrate which is provided with a reaction prevention layer formed on a base material and a catalyst material layer formed on the reaction prevention layer is held at a distance to a plasma generation area which is capable of preventing the substrate from being attacked by an ion generated as a by-product of a radical generated at the plasma generation area and is reachable by the radical at a radical state, and the tip of the antenna is controlled to match with the position of an anti-node of a stationary wave of microwaves.

2. The manufacturing method of oriented carbon nanotubes according to claim 1, wherein the microwave applying member is provided with a second water cooling pipe disposed around the periphery thereof.

3. The manufacturing method of oriented carbon nanotubes according to claim 1, wherein the substrate is maintained at a temperature from 650° C. to 800° C.

4. The manufacturing method of oriented carbon nanotubes according to claim 1, wherein the pressure in the treatment chamber is maintained in a range of 2.66 to 13.33 kPa and the electrical power applied for generating the plasma is maintained in a range of 60 to 180 W.

5. The manufacturing method of oriented carbon nanotubes according to claim 1, wherein the catalyst material layer has a thickness less than 2 nm.

6. The manufacturing method of oriented carbon nanotubes according to claim 1, wherein the antenna is screwed on a male screw member penetrating through the quartz window.

7. The manufacturing method of oriented carbon nanotubes according to claim 1, wherein the microwaves applied by the microwave applying member have a wavelength of 2.45 GHz.

8. The manufacturing method of oriented carbon nanotubes according to claim 1, wherein the substrate is maintained at a temperature from 690 to 740° C., the pressure in the treatment chamber is maintained in a range of 7.98 to 10.6 kPa, and the electrical power applied for generating the plasma is maintained in a range of 120 to 180 W.

9. An antenna typed plasma CVD device, comprising:
a microwave applying member;
a treatment chamber hermetically connected to the microwave applying member via a quartz window,
a first water cooling pipe provided inside the microwave applying member and hermetically connected to the quartz window; and
an antenna protruding to an inside of the treatment chamber and having a tip; and
a mechanism configured to adjust a distance from a substrate to a plasma generating area at the tip of the antenna;
wherein the treatment chamber is configured in a manner of that the plasma is generated when a gas which is the raw material of the carbon nanotubes is circulated in the treatment chamber, the treatment chamber is depressurized to a predefined pressure, and microwaves applied by the microwave applying member are introduced via the quartz window into the treatment chamber, and the tip of the antenna is configured to be controlled to match with the position of an anti-node of a stationary wave of microwaves.

10. The antenna typed plasma CVD device according to claim 9, further comprising a second water cooling pipe disposed around the periphery of the microwave applying member.

11. The antenna typed plasma CVD device according to claim 9, further comprising a substrate heat member disposed inside the treatment chamber and configured to maintain the substrate at a temperature from 650° C. to 800° C.

12. The antenna typed plasma CVD device according to claim 11, wherein the substrate heat member is configured to maintain the substrate at a temperature from 690 to 740° C.

13. The antenna typed plasma CVD device according to claim 9, further comprising a pressure controller configured to maintain a pressure in the treatment chamber in a range of 2.66 to 13.33 kPa; and an electrical power controller configured to maintain an electrical power applied for generating the plasma in a range of 60 to 180 W.

14. The antenna typed plasma CVD device according to claim 13, wherein the pressure controller is configured to maintain the pressure in the treatment chamber in a range of 7.98 to 10.6 kPa, and the electric power controller is configured to maintain the electrical power applied for generating the plasma in a range of 120 to 180 W.

15. The antenna typed plasma CVD device according to claim 9, wherein the antenna is screwed on a male screw member penetrating through the quartz window.

16. The antenna typed plasma CVD device according to claim 9, wherein the microwave applying member is configured to apply microwaves having a wavelength of 2.45 GHz.

* * * * *